United States Patent [19]
Kuroda et al.

[11] Patent Number: 4,563,764
[45] Date of Patent: Jan. 7, 1986

[54] SEMICONDUCTOR LASER DEVICE

[75] Inventors: Takao Kuroda, Kokubunji; Takashi Kajimura; Yasutoshi Kashiwada, both of Hinodemachi; Naoki Chinone, Hachioji; Hirobumi Ouchi, Hino; Tsukuru Ohtoshi, Kokubunji, all of Japan

[73] Assignee: Hitachi, Ltd., Tokyo, Japan

[21] Appl. No.: 531,710

[22] Filed: Sep. 13, 1983

[30] Foreign Application Priority Data

Sep. 13, 1982 [JP] Japan .................. 57-158136

[51] Int. Cl.$^4$ .................................. H01S 3/19
[52] U.S. Cl. ........................... 372/45; 357/17; 372/48
[58] Field of Search ............... 372/44, 45, 46, 48; 357/17

[56] References Cited

U.S. PATENT DOCUMENTS 4,328,469  5/1982  Scifres et al. .................. 372/48

Primary Examiner—James W. Davie
Attorney, Agent, or Firm—Antonelli, Terry & Wands

[57] ABSTRACT

Disclosed is a semiconductor laser device having at least an optical confinement region which includes a first semiconductor layer, and second and third semiconductor layers holding the first semiconductor layer therebetween and having a greater band gap and a lower refractive index than those of the first semiconductor layer, the second and third semiconductor layers having conductivity types opposite to each other; characterized in that the relationship between a donor density ($N_D \times 10^{17}$ cm$^{-3}$) of the n-conductivity type semiconductor layer in the second and third semiconductor layers and a proportion ($\Gamma_n\%$) of an optical output existing in the n-conductivity type semiconductor layer relative to a total optical output of the laser is set at $N_D \times \Gamma_n \geq 500$. Noise characteristics are sharply improved.

6 Claims, 10 Drawing Figures

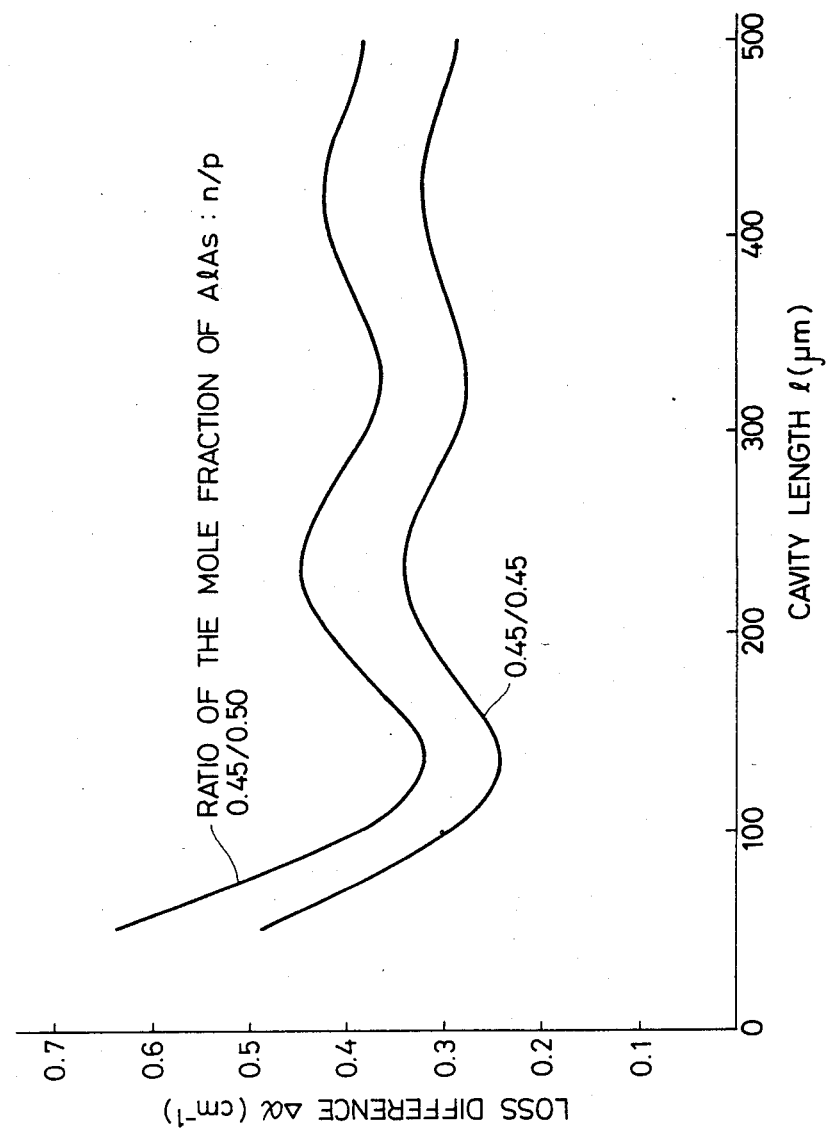

SEMICONDUCTOR LASER DEVICE

The present invention relates to semiconductor laser devices, and more particularly to a semiconductor laser device which oscillates in a single longitudinal mode.

The so-called BH (Buried Hetero) type and CSP (Channeled Substrate Planar) type lasers, which are typical examples of semiconductor lasers of the index-guided type, exhibit a good 'optical output-versus-current' characteristic and are free from astigmatism. For these reasons, such lasers are frequently used as pickup light sources for an optical disk. Ideally, these lasers provide a single longitudinal mode oscillation in which most of the optical output is concentrated in the single longitudinal mode. This can be seen by the spectrum shown in FIG. 1, by way of example. It has been revealed, however, that when the ambient temperature changes, a plurality of longitudinal modes oscillate simultaneously and cause severe noise in some lasers of these types. This hampers control and readout of the optical disk.

The CSP laser is reported in detail in:
(1) IEEE Journal of Quantum Electronics, vol. QE-14, No. 2, February 1978, pp. 89–94; and
(2) J. Appl. Phys. 49(9), September 1978, pp. 4644–4648.

An example of a BH laser is shown in the IEEE Journal of Quantum Electronics, vol. QE-11, No. 7, July 1975.

An object of the present invention is to provide a semiconductor laser device which oscillates in the single longitudinal mode and which is free from the noise stated above.

The present invention consists in improvements in a semiconductor laser of a conventional double heterostructure, namely, a semiconductor laser having at least a first semiconductor layer, and second and third semiconductor layers which hold the first semiconductor layer therebetween and which are greater in the band gap and smaller in the refractive index than the first semiconductor layer. Usually, the oscillation in the single longitudinal mode is realized by employing the index-guided type as the guide setup of an active region. Ordinarily, the second and third semiconductor layers have opposite conductivity types from one another. The relationship between the donor concentration ($N_D \times 10^{17}$ cm$^{-3}$) of the semiconductor layer having the n-conductivity type in the second and third semiconductor layers of such semiconductor laser and the proportion ($\Gamma_n$ (%)) of an optical output existing in the particular n-conductivity type semiconductor layer relative to the total optical output of the laser is set at:

$$N_D \cdot \Gamma_n \geq 500 \tag{1}$$

whereby the aforementioned object can be accomplished.

As a donor impurity, Te (tellurium) which develops a deep level exhibitive of saturable optical absorption is the most useful.

BRIEF DESCRIPTION OF THE DRAWINGS

In the accompanying drawings:

FIG. 5 is a graph showing the relationship between the loss difference $\Delta \alpha$ and the cavity length;

As stated before, the object of the present invention is achieved by setting the relationship between the donor concentration ($N_D \times 10^{17}$ cm$^{-3}$) of the semiconductor layer having the n-conductivity type in the second or third semiconductor layers of the semiconductor laser and the proportion ($\Gamma_n$ (%)) of the optical output existing in that particular n-type semiconductor layer relative to the total optical output of the laser, at $N_D \cdot \Gamma_n \geq 500$.

Figure 1:
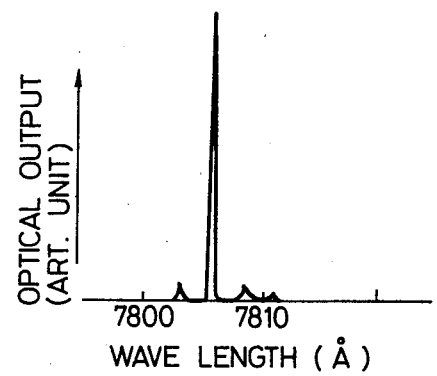
FIG. 1 shows a typical longitudinal mode spectrum distribution of an index-guided type semiconductor laser device which oscillates in a single longitudinal mode.
Figure 2:
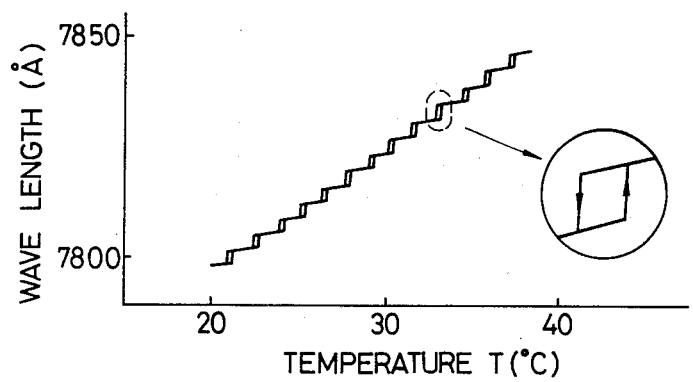
FIG. 2 is a graph showing a typical example of the temperature dependency of an oscillation wavelength observed in a semiconductor laser device in which the single longitudinal mode oscillation is stabilized.

The principle is interpreted as follows. Deep trap levels exhibitive of saturable optical absorption, called DX centers (Donor Complex Centers), are developed in a suitable amount (e.g. typically 5 to 50) within the n-conductivity type clad layer of the semiconductor laser, whereupon a suitable proportion (e.g. preferably 30 to 81%) of the total optical output is caused to exist within the n-conductivity type clad layer. Under such conditions, a difference $\Delta \alpha$ of absorption losses arise between a single desired oscillating longitudinal mode and longitudinal modes other than the single longitudinal mode which suffer heavier losses than said single longitudinal mode, so that the oscillation in the single longitudinal mode is stabilized. Further, a hysteresis as shown in FIG. 2 contributes to the temperature variation of the single longitudinal mode. Only the mode of one wavelength can rise at an identical temperature, and the single longitudinal mode is stabilized. It is considered that, as the loss difference $\Delta \alpha$ becomes greater, the single longitudinal mode will become less variable with temperature changes, and noise arising due to the single longitudinal mode variation attributed to temperature fluctuations will decrease more. FIG. 2 depicts small hysteresis characteristics with temperature differences of one degree odd, and the above-stated influence of the changes of the ambient temperature on the mode concerns such extent of temperature differences.

Usually, in case of doping a semiconductor layer with a donor impurity, the density of DX centers is substantially proportional to the donor density n. Accordingly, letting $\Gamma_n$ denote the percentage of the light distribution existing in the n-clad layer, the loss difference $\Delta \alpha$ has the following relationship:

$$\Delta \alpha \propto N_D \cdot \Gamma_n \tag{2}$$

Figure 3:
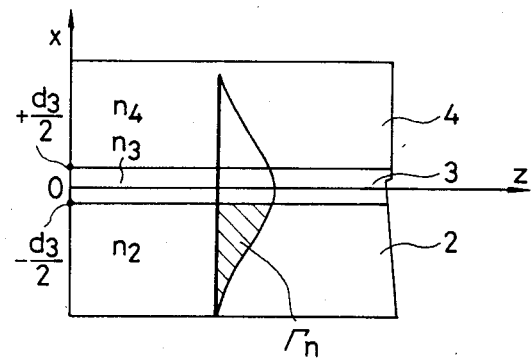
FIG. 3 is a model diagram for explaining the concept of the proportion of a light distribution existent in a clad layer.

Using a three-layer waveguide line model, $\Gamma_n$ is calculated in accordance with a formula mentioned below. FIG. 3 is a diagram showing this model, in which $n_2$, $n_3$ and $n_4$ indicate the refractive indicies of the respective layers. In the figure, numeral 2 designates a clad layer of the n-conductivity type, numeral 3 an active layer, and numeral 4 a clad layer of the p-conductivity type. $\Gamma_n$ denotes the percentage of the light distribution existing in the n-clad layer.

$$\Gamma_n = \frac{\int_{-\infty}^{-d_3/2} E_{y2}^2 \, dx}{\int_{-\infty}^{-d_3/2} E_{y2}^2 \, dx + \int_{-d_3/2}^{d_3/2} E_{y3}^2 \, dx + \int_{d_3/2}^{\infty} E_{y4}^2 \, dx}$$

where $E_{y2}$, $E_{y3}$ and $E_{y4}$ denote electric field intensities in the respective layers 2, 3 and 4. $d_3$ denotes the thickness of the active layer 3.

The electric field intensities $E_{y2}$, $E_{y3}$ and $E_{y4}$ in the above formula giving the proportion $\Gamma_n$ can be determined by solving known characteristic equations whose parameters are the oscillation wavelength ($\lambda$) of the laser, the thickness ($d_3$) of the active layer and the refractive indices $n_2$, $n_3$ and $n_4$ of the respective layers. In addition, the indicies $n_2$, $n_3$ and $n_4$ can be evaluated from the wavelength ($\lambda$) and the AlAs mole fractions of the respective layers. This is explained in, e.g., M. A. Afromowitz: Solid State Commun. 15 (1974) 59.

The fundamental idea of such a waveguide line model is explained in, e.g., 'Semiconductor Lasers and Heterostructure LEDS, HENRY KRESSEL et al, ACADEMIC PRESS, New York 1977', pp. 148-150.

The aforementioned relationsip can be set by various methods as stated below.

The adjustment of the donor density is, of course, made by adjusting the quantity of doping with a donor impurity. The upper limit of the donor density is on the order of $2 \times 10^{18}$ cm$^{-3}$ in view of the occurrence of lattice defects, etc.

Figure 4:
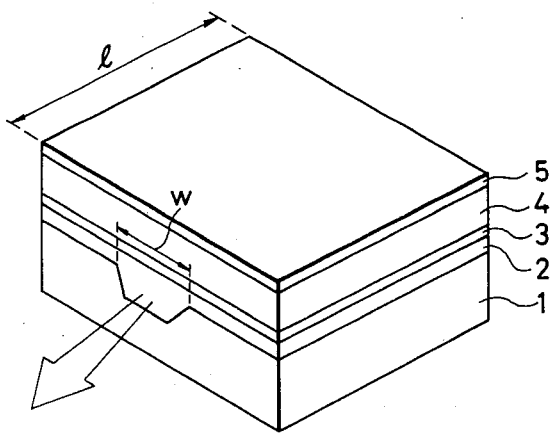
FIG. 4 is a perspective view of a CSP type laser device.

Further, the adjustment of $\Gamma_n$ can be made by adjusting the thickness of the active layer, changing the ratios of the mole fractions of the two clad layers holding the active layer therebetween, etc. Besides, the loss difference $\Delta\alpha$ has dependencies upon the cavity length l of the laser and the width of a light emitting region, i.e., the width w of the active region. FIG. 4 shows how to establish l and w by way of example. It exemplifies an index-guided type semiconductor laser which is usually termed a CSP (Channeled Substrate Planar type) laser.

In FIG. 4, numeral 1 designates a semiconductor substrate, numerals 2 and 4 clad layers, numeral 3 an active layer, and numeral 5 a cap layer. The index-guided structure is realized by utilizing the difference of effective refractive indices produced by the thick and thin portions of the clad layer 2.

Figure 6:
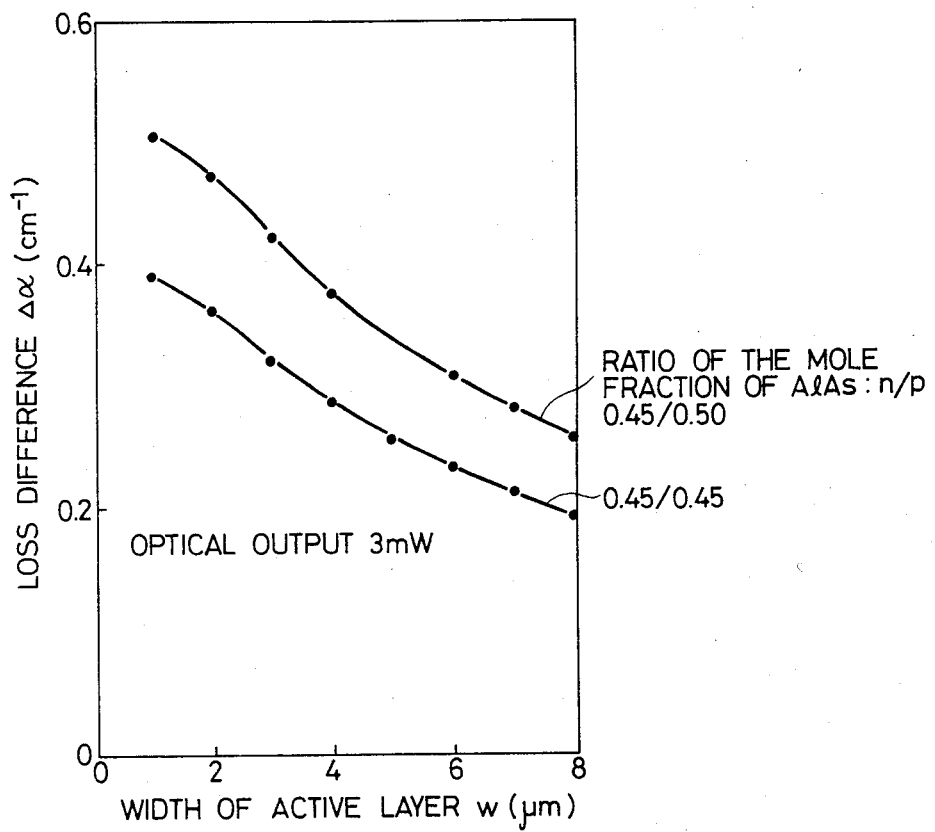
FIG. 6 is a graph showing the relationship between the loss difference and the width of an active layer.

FIGS. 5 and 6 illustrate the relationship between the cavity length (l) and the loss difference and the relationship between the width of the active region and the loss difference, respectively.

It is understood from FIG. 5 that the loss difference presents a curve which has maximum values at some values of l. It is also understood from FIG. 6 that the loss difference $\Delta\alpha$ becomes greater as the active region width w is smaller. In the present invention, accordingly, it is more favorable to set the product $N_D \cdot \Gamma_n$ at or above 500 ($\times 10^{17}$ cm$^{-3} \cdot \%$) and to simultaneously optimize the laser cavity length l and the active region width w to the end of increasing the loss difference $\Delta\alpha$. Results in FIG. 5 were obtained as to examples in each of which the thickness of the active layer was 0.06 μm, the width of the active layer was 4 μm and the n carrier concentration was $1 \times 10^{18}$ cm$^{-3}$. Regarding n/p clad compositions, when $Ga_{1-x}Al_xAs$ denotes the composition of each clad layer, the ratio between the mole fraction (x) of the n-conductivity type clad layer and that (x') of the p-conductivity type clad layer is indicated. Results in FIG. 6 were obtained as to examples in each of which the thickness of the active layer was 0.06 μm, the cavity length was 300 μm and the n carrier concentration was $1 \times 10^{18}$ cm$^{-3}$.

In both FIGS. 5 and 6, the structure in which the mole fraction of the p-type clad layer is greater than that of the n-type clad layer has a greater loss difference $\Delta\alpha$ as compared with the structure in which the mole fractions of both the layers are equal. The reason is that, in the former structure, the refractive index $n_4$ in FIG. 3 becomes smaller than $n_2$, so the light distribution shifts toward the n-type clad layer to increase $\Gamma_n$.

EMBODIMENTS

Now, the present invention will be described in detail with reference to embodiments thereof.

In an AlGaAs-based visible semiconductor laser having an oscillation wavelength of 7800 Å, the CSP type structure shown in FIG. 4 was used as the index-guided type structure oscillating in the single longitudinal mode. On the (100) face of an n-type GaAs substrate 1 (doped with Si, $n \sim 1 \times 10^{18}$ cm$^{-3}$), a photoresist film having a window was formed by a conventional photoresist process. By performing chemical etching through the window, a recess about 1 μm deep was formed in the substrate 1. After removing the photoresist film, a Te-doped n-$Al_xGa_{1-x}As$ clad layer 2 ($0.4 \leq x \leq 0.45$), an undoped $Al_yGa_{1-y}As$ active layer 3 ($y \sim 0.14$, corresponding to the oscillation wavelength of 7800 Å), a Zn-doped p-$Al_zGa_{1-z}As$ clad layer 4 ($0.4 \leq z \leq 0.5$, $p \sim 5 \times 10^{17}$ cm$^{-3}$), and a Te-doped n-GaAs cap layer 5 ($n \sim 1 \times 10^{18}$ cm$^{-3}$) were formed on the substrate by the well-known continuous liquid epitaxy process. At this time, the thickness of the active layer 3 was 0.04-0.07 μm, the thickness of the n-clad layer 2 was 1.3 μm at the middle part of the recess and 0.3 μm on both the sides of the recess, the thickness of the p-clad layer 4 was 1.5 μm, and the thickness of the cap layer 5 was 1 μm. Table 1 lists examples of the semiconductor laser manufactured by way of trial.

TABLE 1

| No. | | 1 | 2 | 3 | 4 | 5 |
|---|---|---|---|---|---|---|
| p-clad layer $Ga_{1-x}Al_xAs$ | Thickness (μm) | 2.0 | 2.0 | 2.0 | 2.0 | 2.0 |
| | Mole fraction x | 0.40 | 0.45 | 0.45 | 0.50 | 0.50 |
| | Carrier concentration ($\times 10^{17}$ cm$^{-3}$) | 4 | 4 | 1 | 2 | 5 |
| Active layer $Ga_{1-x}Al_xAs$ | Thickness (μm) | 0.047 | 0.060 | 0.040 | 0.046 | 0.058 |
| | Width (μm) | 4 | 4 | 3 | 3 | 2 |
| | Mole fraction x | 0.14 | 0.14 | 0.14 | 0.14 | 0.14 |
| n-clad layer $Ga_{1-x}Al_xAs$ | Thickness (μm) | 0.4 (1.2)* | 0.4 (1.2) | 0.4 (1.2) | 0.4 (1.2) | 0.4 (1.2) |
| | Mole fraction x | | | | | |
| | Carrier concentration ($\times 10^{17}$ cm$^{-3}$) | 15 | 10 | 15 | 10 | 15 |
| Cavity length (μm) | | 230 | 420 | 230 | 420 | 230 |
| $\Gamma_n$ (%) | | 44 | 57 | 81 | 66 | 54 |

TABLE 1-continued

| No. | 1 | 2 | 3 | 4 | 5 |
|---|---|---|---|---|---|
| $N_D \cdot \Gamma_n$ | | 660 | 570 | 1215 | 660 | 810 |

*Value in ( ) indicates thickness in recess.

All the examples were excellent in noise characteristics.

Figure 7:
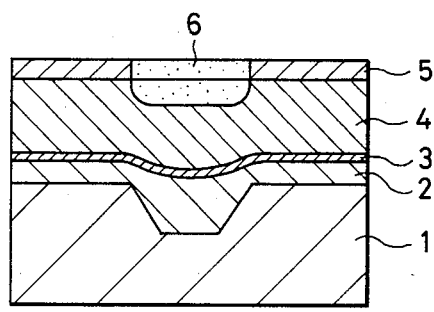
FIG. 7 is a sectional view showing an index-guided type semiconductor laser device whose active layer is curved.

FIG. 7 shows an alternative embodiment of the invention in which an active layer is curved. As was the case with FIG. 4, FIG. 7 has noise characteristics such as shown in FIG. 2. In this structure, the active layer sags slightly at the middle part of a recess, and the thickness of the active layer at its central part is slightly greater (e.g. preferably 0.005 to 0.02 microns greater), so that a transverse mode is controlled. Numerals 1-5 in FIG. 7 are similar to those in the case of the CSP structure in FIG. 4. On the cap layer 5, an $SiO_2$—SiN film was formed by the sputtering evaporation, or an $Si_2O_2$—$Al_2O_3$ film by the CVD (Chemical Vapor Deposition). Thereafter, via the photoresist process, a diffusion window was provided through which Zn was diffused to form a p-type Zn-diffused region 6 serving as a current path. Thereafter, Ti—Mo—Au was evaporated onto the region 6 as a p-type electrode, and AuGeNi—Cr—Pd—Au was evaporated onto the region 1 as an n-type electrode. Lastly, the crystal was cleaved at the (110) faces to complete the device so that the opposing faces become parallel to each other. The results obtained with the FIG. 7 device when $N_D \cdot \Gamma_n \geq 500$ are similar to those discussed for FIG. 4.

Figure 8:
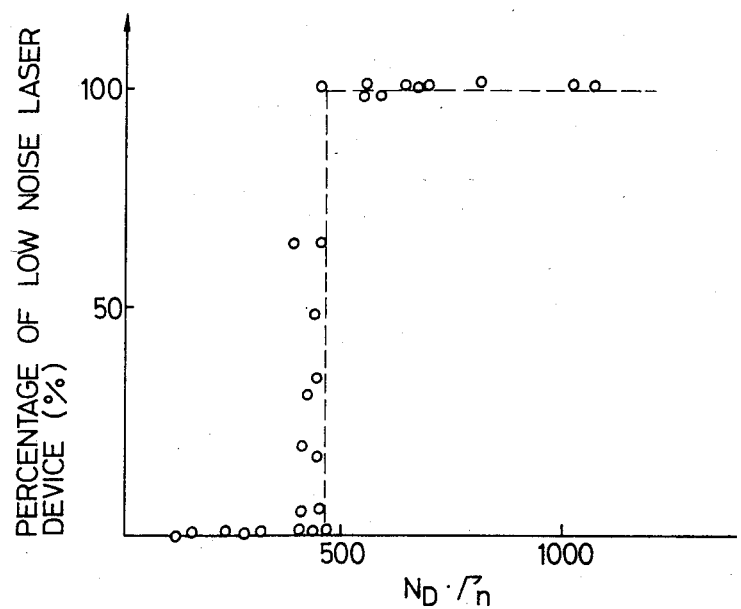
FIG. 8 is a graph showing the relationship between $N_D \cdot \Gamma_n$ and the available percentage of low noise devices.
Figure 9:
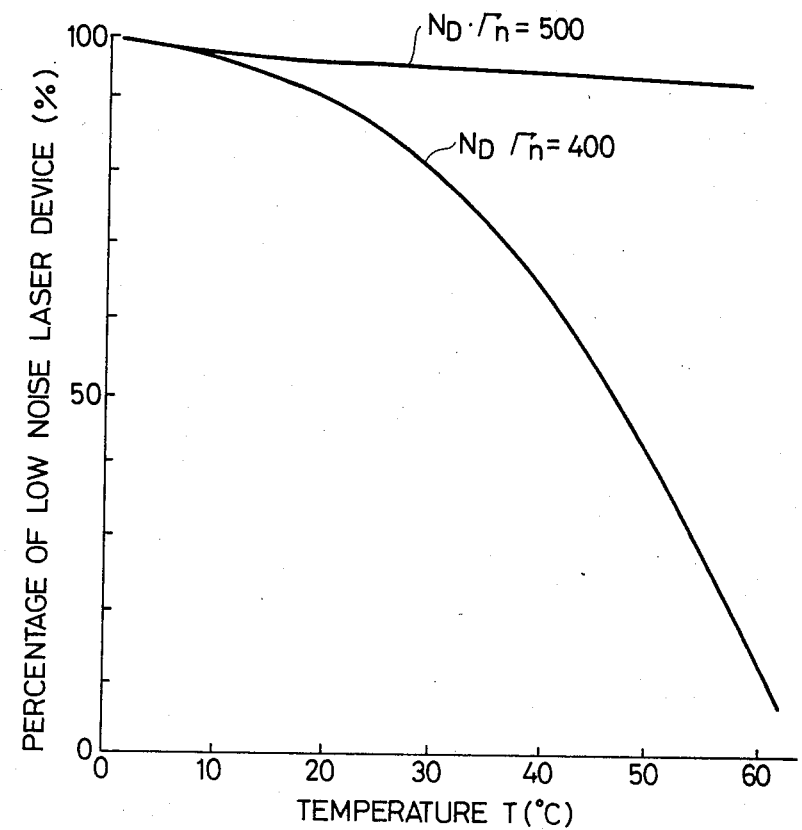
FIG. 9 is a graph showing the temperature dependency of the percentage of low noise laser devices.

In order to change the DX center density in the n-clad layer of either the FIG. 4 or FIG. 7 embodiments, the quantity of doping with Te was changed in a range of $1-20 \times 10^{17}$ cm$^{-3}$ in terms of the carrier density n. Besides, in order to change the percentage $\Gamma_n$ of the optical output in the n-clad layer, the mole ratio (x/z) of AlAs between n-conductivity type and p-conductivity type clad layers was changed into the four sorts; (0.4/0.4), (0.4/0.45), (0.45/0.45) and 0.45/0.50). Further, the thickness d of the active layer was changed in a range of 0.04-0.07 μm, whereby $\Gamma_n$ was changed in a range of 40-70%. The noise characteristics of laser devices produced on the basis of the combinations of these values $N_D$ and $\Gamma_n$ were investigated. As a result, it has been revealed that the available percentage of low noise devices is correlated with the product $N_D \cdot \Gamma_n$ very well as illustrated in FIG. 8 wherein, for purposes of FIGS. 8 and 9, a low noise device was considered to be one having substantially no peaks in its RIN (Relative Intensity Noise) characteristic, as shown, for example, in FIG. 10). That is, it has been revealed that, with the devices satisfying $N_D \cdot \Gamma_n \geq 500$, low noise can be realized at the available percentage of 100%. In each of the examples, the width of the active region was 4 μm, and the cavity length was 300 μm. FIG. 9 illustrates the temperature dependencies of the percentages of the low noise devices as to the device groups of $N_D \cdot \Gamma_n = 400$ and 500 among the devices shown in FIG. 8. At high temperatures, the available percentage lowers in correspondence with the fact that the coefficient of light absorption by the DX centers decreases. As regards the devices of $N_D \cdot \Gamma_n \geq 500$, however, it is seen that a high available percentage above 90% can be attained at temperatures up to 50°-60° C. Further, changes in the noise characteristics based on the following changes in parameters were studied:

(1) The thickness d of the active layer was changed in a range of 0.04-0.07 μm. (2) Among devices which had equal values of $N_D \cdot \Gamma_n$, the laser cavity length l was changed in a range of 100-500 μm, and the active layer width w was changed in a range of 1-8 μm, whereupon the noise characteristics of the laser devices were investigated. The results were that the devices whose cavity lengths l lay within ranges of 210-250 and 400-440 μm had less temperature noise and thus resulted in a higher available percentage of low noise devices than the devices whose cavity lengths l lay outside the ranges. These results were basically the same as shown in FIG. 5. It was also found that the device whose active layer widths w had smaller were less noise and a higher available percentage of low noise devices. These results were basically the same as shown in FIG. 6. It has accordingly been found to be very favorable to set the laser cavity length l within the range of 210-250 μm and the active layer width w within a range of 1-4 μm under the condition of $N_D \cdot \Gamma_n \geq 500$.

While, in the above, the description has been made by taking as examples the semiconductor laser of the CSP type and the semiconductor laser of the CSP type having the curved active layer, it is needless to say that quite similar results are obtained as to other lasers including a transverse mode index-guided type semiconductor laser, a BH (Buried Heterostructure) laser, a TS (Terraced Substrate) laser, a VSIS laser, and a TJS (Transverse Junction Strip) laser. In addition, the wavelength is not restricted to 7800 Å, but similar results have been obtained over the whole range of wavelengths of 6800 Å-8900 Å over which AlGaAs-based lasers are capable of CW oscillations. Besides, the invention is not restricted to lasers fabricated by the liquid epitaxy, but substantially the same results are obtained as to an MBE-grown device having an Sn- or Si-doped clad layer and a device fabricated by an Mo-CVD process and having an Se- or S-doped clad layer. Moreover, the contents of the present invention have been similarly effective in semiconductor laser devices employing laser materials other than AlGaAs, for example, semiconductor laser devices employing group-III-V semiconductor materials such as InGaAsP-based lasers of wavelengths of 1.2-1.6 μm.

Semiconductor laser devices of the single longitudinal mode type can be stably provided by applying the present invention.

Figure 10:
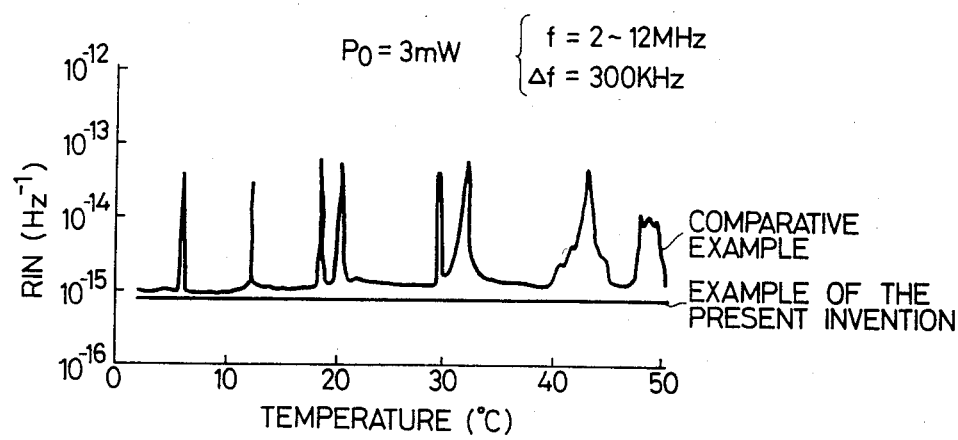
FIG. 10 is a graph showing the temperature dependency of RIN (relative intensity noise).

FIG. 10 illustrates the RIN (Relative Intensity Noise) of semiconductor laser devices which comprises an example to which the present invention is applied with an example to which it is not applied. The results have been obtained under the conditions of an output of 3 mW, a measurement frequency (f) of 2-12 MHz and a measurement bandwidth (Δf) of 300 kHz. The general items of the RIN are detailed in, e.g., a paper by K. Petermann and E. Weidel contained in IEEE, QE-17, No. 7, 1981, p. 1251.

As apparent from FIG. 10, low noise can be maintained at any temperature in accordance with the application of the present invention. In contrast, when the present invention is not applied, noise characteristics become very unstable versus temperatures. It is to be noted in this regard that FIG. 10 is for purposes of example only, and the present invention is not limited only to devices having the particular RIN level shown there.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. In a semiconductor laser device having at least an optical confinement region which is formed on a predetermined substrate and which optical confinement region includes a semiconductor assembly comprising a first semiconductor layer, and second and third semiconductor layers holding said first semiconductor layer therebetween, said second and third semiconductor layers having a greater band gap and a lower refractive index than those of said first semiconductor layer and having conductivity types opposite to each other with one of said second and third layers being doped with a donor impurity to be of n-conductivity type; a first electrode which is formed on the substrate side of said laser device; and a second electrode which is formed on the semiconductor assembly side of said laser device, wherein a relationship between a donor density ($N_D \times 10^{17}$ cm$^{-3}$) of the n-conductivity type semiconductor layer in said second or third semiconductor layers and a proportion ($\Gamma_n$ %) of an optical output existing in said n-conductivity type semiconductor layer relative to a total optical output of said laser is set at $N_D \times \Gamma_n \geq 500$.

2. In a semiconductor laser device according to claim 1, wherein the refractive index of said n-conductivity type semiconductor layer in said second and third semiconductor layers is higher than that of the p-conductivity type semiconductor layer.

3. In a semiconductor laser device according to claim 1, wherein a doping impurity of said n-conductivity type semiconductor layer is Te.

4. In a semiconductor laser device according to claim 2, wherein a doping impurity of said n-conductivity type semiconductor layer is Te.

5. In a semiconductor laser device according to claim 1, wherein said optical confinement region of said laser device has a laser cavity length within a range of 210–250 μm and wherein the width of said first semiconductor layer is within a range of 1–4 μm.

6. In a semiconductor laser device according to claim 1, wherein said optical confinement region of said laser device has a laser cavity length within a range of 400–440 μm and wherein the width of said first semiconductor layer is within a range of 1–4 μm.

* * * * *